(12) United States Patent
Bang et al.

(10) Patent No.: US 10,797,146 B2
(45) Date of Patent: Oct. 6, 2020

(54) THIN FILM TRANSISTOR SUBSTRATE AND MANUFACTURING METHOD THEREOF

(71) Applicant: Samsung Display Co., Ltd., Yongin-si, Gyeonggi-do (KR)

(72) Inventors: Seokhwan Bang, Yongin-si (KR); Soojung Chae, Seoul (KR); Kapsoo Yoon, Seoul (KR); Woogeun Lee, Yongin-si (KR); Sunghoon Lim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/293,560

(22) Filed: Mar. 5, 2019

(65) Prior Publication Data

US 2019/0341463 A1    Nov. 7, 2019

(30) Foreign Application Priority Data

May 4, 2018 (KR) .................. 10-2018-0051982

(51) Int. Cl.
| | |
|---|---|
| *H01L 27/12* | (2006.01) |
| *H01L 29/423* | (2006.01) |
| *H01L 29/786* | (2006.01) |
| *H01L 29/66* | (2006.01) |
| *H01L 29/51* | (2006.01) |

(52) U.S. Cl.
CPC .... *H01L 29/42384* (2013.01); *H01L 27/1237* (2013.01); *H01L 29/42364* (2013.01); *H01L 29/517* (2013.01); *H01L 29/6675* (2013.01); *H01L 29/7869* (2013.01)

(58) Field of Classification Search
None
See application file for complete search history.

(56) References Cited

U.S. PATENT DOCUMENTS

| 8,809,154 B2 | 8/2014 | Koezuka et al. |
| 9,171,942 B2 | 10/2015 | Mochizuki et al. |
| (Continued) | | |

FOREIGN PATENT DOCUMENTS

| JP | 4982619 B1 | 7/2012 |
| JP | 2014-199951 A | 10/2014 |
| (Continued) | | |

*Primary Examiner* — Benjamin P Sandvik
(74) *Attorney, Agent, or Firm* — Lewis Roca Rothgerber Christie LLP

(57) ABSTRACT

A thin film transistor substrate includes: a substrate; an oxide semiconductor layer disposed on the substrate; a gate electrode disposed on the substrate; a gate insulating layer interposed between the oxide semiconductor layer and the gate electrode; and a source electrode and a drain electrode connected to the oxide semiconductor layer, the source electrode and the drain electrode being spaced apart from each other. The gate insulating layer includes: a first gate insulating layer having an oxygen content lower than that of a stoichiometric composition; and a second gate insulating layer including a material substantially the same as a material which the first gate insulating layer may include, and having an oxygen content higher than that of the first gate insulating layer, and the first gate insulating layer and the oxide semiconductor layer directly contact each other.

14 Claims, 11 Drawing Sheets

(56) References Cited

U.S. PATENT DOCUMENTS

| | | |
|---|---|---|
| 9,269,823 B2 | 2/2016 | Endo et al. |
| 2014/0340608 A1* | 11/2014 | Yamazaki ............. H01L 27/124 |
| | | 349/47 |
| 2017/0330938 A1* | 11/2017 | Baeck ................. H01L 29/1054 |

FOREIGN PATENT DOCUMENTS

| | | |
|---|---|---|
| JP | 2017-108065 A | 6/2017 |
| JP | 2017-157853 A | 9/2017 |

* cited by examiner

THIN FILM TRANSISTOR SUBSTRATE AND MANUFACTURING METHOD THEREOF

CROSS-REFERENCE TO RELATED APPLICATION

This application claims priority to and the benefit of Korean Patent Application No. 10-2018-0051982, filed on May 4, 2018, in the Korean Intellectual Property Office (KIPO), the disclosure of which is incorporated herein by reference in its entirety.

BACKGROUND

1. Field

Embodiments of the present invention relate to a thin film transistor ("TFT") substrate and a method of manufacturing the TFT substrate, and more particularly, to a TFT substrate utilizing a metal oxide semiconductor thin film and a method of manufacturing the TFT substrate.

2. Description of the Related Art

In general, TFTs are utilized in various electronic devices, such as flat panel display devices. For example, the TFTs are utilized as switching elements or driving elements in various flat panel display devices, such as liquid crystal display ("LCD") devices, organic light emitting diode ("OLED") display devices, and electrophoretic display devices.

Such a TFT includes a gate electrode connected to a gate line for transmitting a scan signal, a source electrode connected to a data line for transmitting a signal to be applied to a pixel electrode, a drain electrode facing the source electrode, and a semiconductor layer electrically connected to the source and drain electrodes.

The semiconductor layer of the TFT is an important element for determining the characteristics of the TFT. Such a semiconductor layer generally includes amorphous silicon, polycrystalline silicon or oxide semiconductor. Metal oxides, however, have higher electron mobility than that of amorphous silicon, lower cost than that of polycrystalline silicon, and higher uniformity than that of polycrystalline silicon.

It is to be understood that this background of the technology section is intended to provide useful background for understanding the technology and as such, the technology background section may include ideas, concepts or recognitions that were not part of what was known or appreciated by those skilled in the pertinent art prior to a corresponding effective filing date of subject matter disclosed herein.

SUMMARY

In order to apply the metal oxide semiconductor to the TFT, the charge mobility and the reliability should be increased. However, when such a metal oxide semiconductor layer is formed, oxygen defects may largely occur due to, for example, displacement of excess oxygen, and thus the film quality of the semiconductor layer may be lowered. Accordingly, the electrical characteristics and the photoelectric reliability of elements, e.g., a threshold voltage Vth of the TFT, may be degraded.

Aspects according to embodiments of the present invention may be directed to a TFT substrate that has high reliability by significantly reducing oxygen defects in an oxide semiconductor and at an interface between the oxide semiconductor and a gate insulating layer, and to a method of manufacturing the TFT substrate.

According to an embodiment, a thin film transistor substrate includes: a substrate; an oxide semiconductor layer on the substrate; a gate electrode on the substrate; a gate insulating layer between the oxide semiconductor layer and the gate electrode; and a source electrode and a drain electrode both connected to the oxide semiconductor layer, the source electrode and the drain electrode being spaced apart from each other. The gate insulating layer includes: a first gate insulating layer including a first material and having an oxygen content lower than that of a stoichiometric composition of the first material; and a second gate insulating layer including a second material substantially the same as the first material, and having an oxygen content higher than that of the first gate insulating layer, and the first gate insulating layer and the oxide semiconductor layer directly contact each other.

The first gate insulating layer may include a metal oxide or a metal oxynitride that has an oxygen content lower than that of the stoichiometric composition of the first material.

The first gate insulating layer may include one or more materials selected from: $SiO_x$ ($0<x<2$), $AlO_x$ ($0<x<3/2$), $ZnO_x$ ($0<x<1$), $ZrO_x$ ($0<x<2$), $HfO_x$ ($0<x<2$), $GaO_x$($0<x<3/2$), $TiO_x$ ($0<x<2$), $TaO_x$ ($0<x<3/2$), $MnO_x$ ($0<x<2$), $LaO_x$ ($0<x<3/2$), $SiO_xNy$ ($0<x<1$, $0<y<2/3$, and $0<x+y<5/3$), $AlO_xNy$ ($0<x<3/4$, $0<y<1/2$, and $0<x+y<5/4$), and $GaO_xNy$ ($0<x<3/4$, $0<y<1/2$, and $0<x+y<5/4$).

The first gate insulating layer may include silicon oxide represented by $SiO_x$, where $0<x<2$, and an atomic weight ratio O/Si of oxygen to silicon in the silicon oxide may be substantially equal to or more than about 1.5 and less than about 2.0.

The silicon oxide may have an atomic weight ratio of O/Si that decreases along a thickness direction as a distance from the oxide semiconductor layer decreases.

The first gate insulating layer may have an excess hydrogen content of about $5.0 \times 10^{20}$ atoms/cm$^3$.

The first gate insulating layer may have a hydrogen content that varies along a thickness direction of the first gate insulating layer.

The first gate insulating layer may have a thickness substantially equal to or less than about 500 Å.

The gate insulating layer may further include a third gate insulating layer including a third material different from the first material.

The third gate insulating layer may is an oxide-based insulating layer, an oxynitride-based insulating layer, or a nitride-based insulating layer.

The oxide semiconductor layer may include a metal oxide semiconductor including oxygen, and has a density of oxygen defects of about $2.0 \times 10^{17}$ cm$^{-3}$ eV$^{-1}$.

The oxide semiconductor layer may include at least one selected from: indium (In), gallium (Ga), tin (Sn), zirconium (Zr), vanadium (V), hafnium (Hf), cadmium (Cd), germanium (Ge), chromium (Cr), titanium (Ti), and zinc (Zn).

The thin film transistor substrate may include: the substrate; the oxide semiconductor layer on the substrate; the first gate insulating layer on the oxide semiconductor layer; the second gate insulating layer on the first gate insulating layer; the gate electrode on the second gate insulating layer; and the source electrode and the drain electrode both connected to the oxide semiconductor layer, the source electrode and the drain electrode being spaced apart from each other.

The thin film transistor substrate may include: the substrate; the gate electrode on the substrate; the second gate insulating layer on the gate electrode; the first gate insulating layer on the second gate insulating layer; the oxide semiconductor layer on the first gate insulating layer; and the source electrode and the drain electrode connected to the oxide semiconductor layer, the source electrode and the drain electrode being spaced apart from each other.

According to an embodiment, a method of manufacturing a thin film transistor substrate includes: forming an oxide semiconductor layer on a substrate; forming a gate insulating layer on the oxide semiconductor layer, the gate insulating layer including at least two layers; forming a gate electrode on the gate insulating layer; and forming a source electrode and a drain electrode on the gate insulating layer and connecting each of the source electrode and the drain electrode to the oxide semiconductor layer. The forming of the gate insulating layer includes: (i) depositing a first gate insulating layer on the oxide semiconductor layer utilizing at least one of a first power (P1) and a first volume ratio of a reaction gas to a metal precursor gas (G1), the first gate insulating layer including a first material and having an oxygen content lower than that of a stoichiometric composition of the first material; and (ii) depositing a second gate insulating layer including a second material substantially the same as the first material utilizing at least one of a second power (P2) and a second volume ratio of a reaction gas to a metal precursor gas (G2), the second gate insulating layer having an oxygen content higher than that of the first gate insulating layer, where P1<P2 and G1<G2.

The the (i) the depositing of the first gate insulating layer and (ii) the depositing of the second gate insulating layer may be performed under a condition that satisfies the following Equation 1:

$$\frac{P_1}{P_2} \le 0.8,$$ [Equation 1]

where P1 is the first power utilized in depositing the first gate insulating layer, and P2 is the second power utilized in depositing the second gate insulating layer.

The the (i) the depositing of the first gate insulating layer and (ii) the depositing of the second gate insulating layer may be performed under a condition that satisfies the following Equation 2:

$$1 \le G1 < G2,$$ Equation 2 where G1 i the volume ratio of the reaction gas to the metal precursor gas when depositing the first gate insulating layer, and G2 is the volume ratio of the reaction gas to the metal precursor gas when depositing the second gate insulating layer.

The reaction gas utilized in the depositing of the first or second gate insulating layer may be one or more gases selected from $N_2O$, $O_3$, $O_2$, $NH_3$, $H_2$, and $N_2$, and the metal precursor gas utilized in the depositing of the first or second gate insulating layer may be a precursor gas including at least one selected from Si, Al, Ti, Ga, Ta, Mn, Zn, Zr, Hf and La.

The forming of the gate insulating layer may further include: (iii) forming, on the second gate insulating layer, a third gate insulating layer including a third material different from the first material.

The method may further include performing annealing after the forming of the gate insulating layer.

The foregoing is illustrative only and is not intended to be in any way limiting. In addition to the illustrative aspects, embodiments and features described above, further aspects, embodiments and features will become apparent by reference to the drawings and the following detailed description.

BRIEF DESCRIPTION OF THE DRAWINGS

A more complete appreciation of the present invention will become more apparent by describing in more detail embodiments thereof with reference to the accompanying drawings, in which.

DETAILED DESCRIPTION

Figure 1:
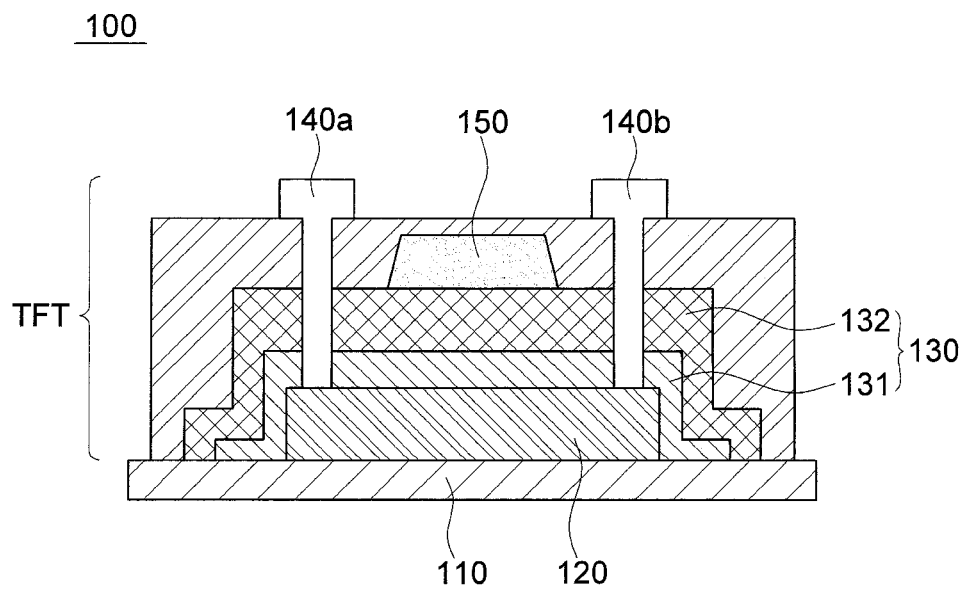
FIG. 1 is a cross-sectional view illustrating a TFT substrate according to an embodiment of the present invention.

Embodiments will now be described more fully hereinafter with reference to the accompanying drawings. Although the invention may be modified in various manners and have several embodiments, example embodiments are illustrated in the accompanying drawings and will be mainly described in the specification. However, the scope of the invention is not limited to these embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further, when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" or the like, may be utilized herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

In addition, throughout the specification, when an element is referred to as being viewed "in a plan view", the element is viewed from the above, and when an element is referred to as being viewed "on a cross-sectional view", a cross-sectional surface of the element that is cut vertically is viewed from the lateral side.

Throughout the specification, when an element is referred to as being "connected" to another element, the element may be "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," or the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein. Expressions such as "at least one of," when preceding a list of elements, modify the entire list of elements and do not modify the individual elements of the list. Further, the use of "may" when describing embodiments of the present invention refers to "one or more embodiments of the present invention."

The term "about," "substantially" or "approximately" as used herein is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within +30%, 20%, 10%, 5% of the stated value. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the present invention. Like reference numerals refer to like elements throughout the specification.

Hereinafter, an embodiment of the present invention will be described with reference to FIGS. 1 to 3.

FIG. 1 is a cross-sectional view illustrating a TFT substrate 100 according to an embodiment of the present invention.

Referring to FIG. 1, the TFT substrate 100 according to an embodiment of the present invention includes a TFT that includes an oxide semiconductor as an active layer on a substrate 110. In one embodiment, the TFT substrate 100 includes the substrate 110, an oxide semiconductor layer 120, a gate insulating layer 130, a gate electrode 150, a source electrode 140a, and a drain electrode 140b.

The substrate 110 may include various suitable materials. For example, the substrate 110 may include a transparent glass material that includes silicon oxide ($SiO_2$) as a main component. However, embodiments are not limited thereto. For example, in an exemplary embodiment of the present invention, the substrate 110 may include a transparent plastic material and have flexibility. Such a plastic material may be an organic material selected from, for example, polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP). It is not necessary that the substrate 110 invariably includes a transparent material, and the substrate 110 may include a suitable metal material (e.g., a metal material known in the art). For example, the substrate 110 may include at least one of, for example, iron (Fe), chromium (Cr), manganese (Mn), nickel (Ni), titanium (Ti), molybdenum (Mo), stainless steel (SUS), invar alloys, inconel alloys, and kovar alloys. The substrate 110 is not particularly limited to the shape, structure, size, and the like, provided that it has a main surface capable of forming a film thereon, and can be appropriately selected according to the purpose of use. The substrate 110 may have a single-layer structure or a multilayer structure in which two or more layers are stacked.

A buffer layer may be disposed on the substrate 110. The buffer layer may provide a planar surface on top of the substrate 110 and may block foreign matter or moisture from penetrating through the substrate 110. For example, the buffer layer may include an inorganic material (such as silicon oxide ($SiO_2$), silicon nitride ($Si_3N_4$), silicon oxynitride (SiON), aluminum oxide ($Al_2O_3$), aluminum nitride (AlN), titanium oxide ($TiO_2$), and titanium nitride (TiN)), or an organic material (such as polyimide, polyester, and acryl), and may have a multilayer structure including the above-described materials.

The TFT that includes an oxide semiconductor as an active layer is disposed on the substrate 110. The TFT may include the oxide semiconductor layer 120, the gate electrode 150, the source electrode 140a, and the drain electrode 140b.

The TFT may be classified into a bottom gate type (e.g., a bottom gate TFT) and a top gate type (e.g., a top gate TFT) according to the position of the gate electrode 150 with respect to the semiconductor layer 120, or may be classified into a coplanar type (e.g., a coplanar TFT), a staggered type (e.g., a staggered TFT), and the like, according to the position of a channel and the arrangement of the source and drain electrodes 140a and 140b. Hereinafter, the present embodiment will be described on the premise that the TFT is a top gate type in which the oxide semiconductor layer 120, the gate electrode 150, the source electrode 140a and the drain electrode 140b are sequentially arranged. However, the present embodiment is not limited thereto, and various kinds of TFTs may be applied.

The oxide semiconductor layer 120 is disposed on the buffer layer. The oxide semiconductor layer 120 may include, without limitation, a suitable oxide semiconductor material (e.g., an oxide semiconductor material known in the art). For example, the oxide semiconductor layer may be a metal (or metalloid) oxide including at least one element selected from, for example, indium (In), gallium (Ga), tin (Sn), zirconium (Zr), vanadium (V), hafnium (Hf), cadmium (Cd), germanium (Ge), chromium (Cr), titanium (Ti), and zinc (Zn). As a specific example, the oxide semiconductor layer 120 may include: unary metal oxides based on, for example, In—O, Sn—O, Zn—O (ZnO), Ti—O, and Cd—O; binary metal oxides based on, for example, In—Sn—O (ITO), In—Zn—O (IZO), Sn—Zn—O, Al—Zn—O, Zn—Mg—O, Sn—Mg—O, and In—Mg—O; ternary metal oxides based on, for example, In—Ga—Zn—O (IGZO), In—Sn—Zn—O (ITZO), In-Al—Zn—O (IAZO), Sn—Ga—Zn—O, Al—Ga—Zn—O, Sn-Al—Zn—O, and Cd—Sn—O; and quaternary metal oxides based on, for example, In—Sn—Ga—Zn—O. A composition ratio of the above-described oxide semiconductor is not particularly limited, and may be appropriately adjusted within a suitable composition range (e.g., a composition range known in the art). In addition, a thickness of the oxide semiconductor layer 120 is not particularly limited and may be appropriately adjusted within a suitable range (e.g., a range known in the art).

The gate insulating layer 130 is disposed on the oxide semiconductor layer 120 and serves to insulate the oxide semiconductor layer 120 and the gate electrode 150 from each other. That is, the gate insulating layer 130 may be formed on the substrate 110 to cover an upper portion and a side portion of the oxide semiconductor layer 120.

The oxide semiconductor is a compound semiconductor including ionic bonds of metal cations and oxygen anions. A major carrier of the oxide semiconductor is an electron, which is n-type. One of the factors that determine the electrical properties of an oxide semiconductor is oxygen vacancy (e.g., oxygen defect). If the oxygen vacancy easily occurs in an oxide semiconductor, it may lead to an increase in concentration of the carriers in the oxide semiconductor and the mobility may increase. However, when lots of (e.g., excessive amount of) oxygen defects occur due to oxygen that exists excessively in the oxide semiconductor, the film quality of the semiconductor layer is lowered and the stability of a threshold voltage Vth may be adversely affected. For example, excess carriers that may be generated by the oxygen defects may cause an increase in off-current or a change in the threshold voltage Vth.

Particularly, in order to mass-produce panels with oxide semiconductor TFTs, the photoelectric reliability should be secured. In order to secure the photoelectric reliability, the oxygen deficiency in the active layer may be controlled by supplying additional oxygen to the oxide semiconductor layer or by performing oxygen treatment on a protective film, or a subsequent process (such as a high temperature annealing process) may be performed. These processes may cause disadvantages such as a decrease in a sputtering rate due to the additional supply of oxygen, an increase in the particle size of the oxide, and/or excessive development of semiconductor characteristics arising from plasma damage.

Accordingly, in one or more embodiments of the present invention, the structure of the gate insulating layer 130 that directly contacts the oxide semiconductor layer 120 is partially modified to control the physical properties of the active layer formed of the oxide semiconductor, thereby securing the photoelectric reliability.

In an exemplary embodiment, the gate insulating layer 130 that includes two or more layers is disposed on the oxide semiconductor layer 120. For example, a first gate insulating layer 131 that has an oxygen content lower than that of a stoichiometric composition and/or an excess hydrogen content is disposed at an interface area in contact with the oxide semiconductor layer 120. The hydrogen included in the first gate insulating layer 131 is diffused to an interface between the first gate insulating layer 131 and the oxide semiconductor layer 120 and to the inside of the oxide semiconductor layer 120 to absorb excess oxygen. Further, part of the hydrogen introduced into the oxide semiconductor layer 120 is doped to reduce oxygen defects, thus exhibiting effects of improving the photoelectric reliability. In addition, the oxide semiconductor has characteristics in which the mobility increases as the concentration of carriers increases to about $10 \times 10^{21}$ $cm^{-3}$. According to embodiments of the present invention, the hydrogen introduced into the oxide semiconductor layer 120 not only removes interfacial defects, but also partially increases formation of carriers for transmitting current, and thus electric characteristics such as charge mobility or variation of threshold voltage Vth may be improved.

According to an exemplary embodiment of the present invention, a content of hydrogen included in the first gate insulating layer 131 may be substantially equal to or more than about $5.0 \times 10^{20}$ atoms/$cm^3$. For example, the hydrogen content may be in a range from about $5.0 \times 10^{20}$ atoms/$cm^3$ to about $2.0 \times 10^{21}$ atoms/$cm^3$, and more particularly, in a range from about $5.0 \times 10^{20}$ atoms/$cm^3$ to about $1.0 \times 10^{21}$ atoms/$cm^3$. In addition, the first gate insulating layer 131 may have a hydrogen content that varies along a thickness direction. For example, the hydrogen content may increase toward the center of the first gate insulating layer 131 (e.g., along the thickness direction), and may decrease toward opposite side surfaces of the first gate insulating layer 131.

The oxide semiconductor layer 120 in which hydrogen is partially introduced may have a tendency in which a concentration of oxygen decreases in at least a partial region adjacent to the first gate insulating layer 131. According to an exemplary embodiment of the present invention, comparing to a stoichiometric composition of the oxide semiconductor layer at an interface where the first gate insulating layer 131 is not provided, the oxygen content of the metal oxide, as compared to a total oxygen content (e.g., 100%) of the corresponding oxide semiconductor layer 120 according to embodiments of the present disclosure, may decrease by about 10% or less. A thickness of the oxide semiconductor layer in which the oxygen concentration is reduced is not particularly limited.

The oxide semiconductor layer 120 according to an embodiment of the present invention in contact with the first gate insulating layer 131 may significantly reduce oxygen defects in the oxide semiconductor layer 120, as well as reducing the interfacial defects, due to hydrogen influx. According to another exemplary embodiment of the present invention, the oxide semiconductor layer 120 may have a density of oxygen defects substantially equal to or less than about $2.0\times10^{17}$ $cm^{-3}$ $eV^{-1}$, for example, in a range from about $1.50\times10^{17}$ $cm^{-3}$ $eV^{-1}$ to about $2.0\times10^{17}$ $cm^{-3}$ $eV^{-1}$.

The first gate insulating layer 131 may include a metal oxide or a metal oxynitride (e.g., that are known in the art) and have an oxygen content lower than that of the stoichiometric composition. For example, the gate insulating layer 131 may include at least one material selected from, for example, silicon oxide, aluminum oxide, gallium oxide, titanium oxide, tantalum oxide, manganese oxide, zinc oxide, zirconium oxide, hafnium oxide, lanthanum oxide, silicon oxynitride, aluminum oxynitride, and gallium oxynitride. As a more specific example, the first gate insulating layer 131 may include at least one material selected from, for example, $SiO_x$ ($0<x<2$), $AlO_x$ ($0<x<3/2$), $ZnO_x$ ($0<x<1$), $ZrO_x$ ($0<x<2$), $HfO_x$ ($0<x<2$), $GaO_x$ ($0<x<3/2$), $TiO_x$ ($0<x<2$), $TaO_x$ ($0<x<3/2$), $MnO_x$ ($0<x<2$), $LaO_x$ ($0<x<3/2$), $SiO_xNy$ ($0<x<1$, $0<y<2/3$, and $0<x+y<5/3$), $AlO_xNy$ ($0<x<3/4$, $0<y<1/2$, and $0<x+y<5/4$), and $GaO_xNy$ ($0<x<3/4$, $0<y<1/2$, and $0<x+y<5/4$).

According to an exemplary embodiment of the present invention, the first gate insulating layer 131 includes silicon oxide ($SiO_x$, where $x<2.0$), and an atomic weight ratio (O/Si) of oxygen to silicon in the silicon oxide may be substantially equal to or higher than about 1.5 and less than about 2.0, for example, in a range from about 1.6 to about 1.8. In an exemplary embodiment, when the first gate insulating layer 131 includes silicon oxide ($SiO_x$, where $x<2.0$), the silicon oxide may have an atomic weight ratio (O/Si) that decreases along the thickness direction as a distance from the oxide semiconductor layer 120 decreases. That is, while the first gate insulating layer 131 based on silicon oxide has the above-described atomic weight ratio of O/Si, the atomic weight ratio of O/Si of the first gate insulating layer 131 is relatively high at a region adjacent to the second gate insulating layer 132, and is relatively low at a region adjacent to the oxide semiconductor layer 120. In addition, the thickness of the first gate insulating layer 131 may be substantially equal to or less than about 500 Å, for example, in a range from about 1 Å to about 500 Å. However, embodiments are not limited thereto.

The gate insulating layer 130 may have a multilayer structure including two or more layers, each of which includes a material substantially the same as or different from the material which the first gate insulating layer 131 includes. For example, the gate insulating layer 130 may include: at least one of a second gate insulating layer 132 that includes a material substantially the same as the material included in the first gate insulating layer 131 and has an oxygen content higher than that of the first gate insulating layer 131; and a third gate insulating layer 133 that includes a material different from the material included in the first gate insulating layer 131. As the first gate insulating layer 131 described above includes an oxide-based material or oxynitride-based material, the second gate insulating layer 132 may be one of an oxide-based insulating layer and an oxynitride-based insulating layer (e.g., that are known in the art). In this embodiment, the second gate insulating layer 132 may have a stoichiometric composition that is different from that of the first gate insulating layer 131 in contact with the second gate insulating layer 132. For example, the second gate insulating layer 132 may have an oxide-based or oxynitride-based composition that satisfies a stoichiometric ratio. In addition, the third gate insulating layer 133 may be one of an oxide-based insulating layer, an oxynitride-based insulating layer, and a nitride-based insulating layer. For example, the gate insulating layer 130 may include the first gate insulating layer 131 that includes $SiO_x$ (where $x<2$); and the second gate insulating layer 132 that includes silicon oxide ($SiO_2$). In another exemplary embodiment, the gate insulating layer 130 may include the first gate insulating layer 131 that includes $SiO_x$ (where $x<2$); the second gate insulating layer 132 that includes silicon oxide ($SiO_2$); and the third gate insulating layer 133 that includes silicon nitride (SiN).

The thickness of the gate insulating layer 130 is not particularly limited and may be appropriately adjusted within a suitable range (e.g., a range known in the art). For example, the thickness of the gate insulating layer 130 may vary depending on the material of the gate insulating layer 130, but may be substantially equal to or more than about 10 nm and substantially equal to or less than about 10 μm, for example, in a range from about 50 nm to about 1000 nm, or in a range from about 100 nm to about 500 nm.

The gate electrode 150 is disposed on the gate insulating layer 130, for example, on the second gate insulating layer 132 or the third gate insulating layer 133 of the gate insulating layer 130. The gate electrode 150 may be connected to a gate line for applying an on/off signal to the TFT. The gate electrode 150 may include a suitable low resistive metal material (e.g., known in the art). In consideration of the closeness of contact to an adjacent layer, surface flatness of a layer to be laminated thereon, and/or processability, the gate electrode 150 may have a single-layer structure or a multilayer structure, with each layer including at least one of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and the like.

An insulating interlayer may be disposed on the gate electrode 150. The insulating interlayer insulates the gate electrode 150 from the source electrode 140a and the drain electrode 140b. The insulating interlayer may have a single-layer structure or a multilayer structure, with each layer including an inorganic material. For example, the inorganic material may be metal oxide or metal nitride such as, for example, silicon oxide ($SiO_2$), silicon nitride ($Si_3N_4$), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), or the like.

The source electrode 140a and the drain electrode 140b are disposed on the gate insulating layer 130, and may be disposed on the insulating interlayer in a selective manner. Each of the source electrode 140*a* and the drain electrode 140*b* may have a single-layer structure or a multilayer structure, with each layer including a suitable metal (e.g., a metal known in the art). The metal may be at least one of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and the like. The source electrode 140*a* and the drain electrode 140*b* are each disposed to contact an area of the oxide semiconductor layer 120. For example, the gate insulating layer 130 and/or the insulating interlayer is formed to expose a source area and a drain area of the oxide semiconductor layer 120, and the source electrode 140*a* and the drain electrode 140*b* are formed to contact the source area and the drain area of the oxide semiconductor layer 120, respectively.

Figure 2:
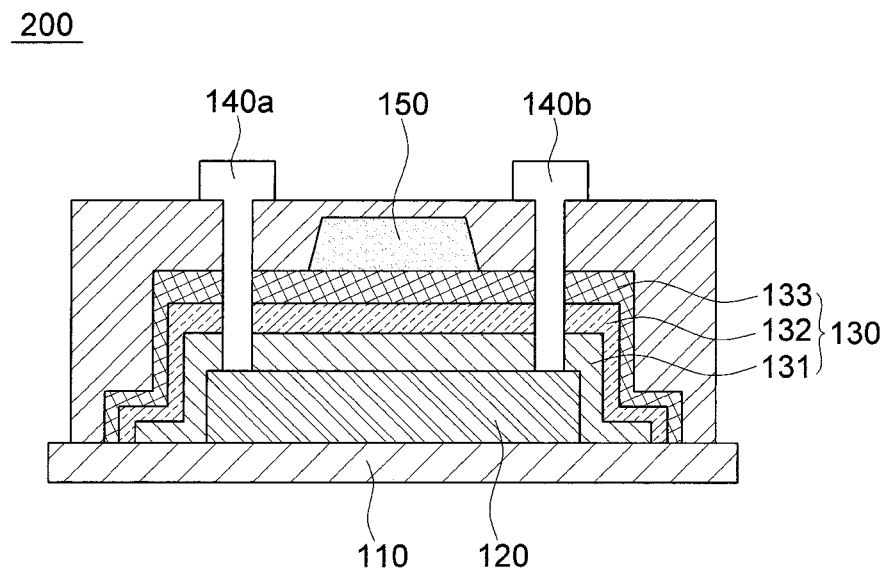
FIG. 2 is a cross-sectional view illustrating a TFT substrate according to another embodiment of the present invention.

FIG. 2 is a cross-sectional view illustrating a TFT substrate 200 according to another embodiment of the present invention. In FIG. 2, the same reference numerals as those in FIG. 1 denote the same members.

In the following description of FIG. 2, the descriptions provided above with reference to FIG. 1 will not be given again, and only differences will be described. Referring to FIG. 2, the TFT substrate 200 according to the present embodiment includes an insulating layer 130 that has a triple-layer structure in which a first gate insulating layer 131, a second gate insulating layer 132, and a third gate insulating layer 133 are sequentially stacked, as compared with FIG. 1. Here, the first gate insulating layer 131 in the gate insulating layer 130 contacts an oxide semiconductor layer 120, and part of the third gate insulating layer 133 contacts a gate electrode 150.

The description of the TFT of FIG. 1 can be applied to the material, the structure, the oxide semiconductor, and the like of each constituent element of the present embodiment as it is.

FIG. 2 specifically illustrates an exemplary embodiment in which the first gate insulating layer 131, the second gate insulating layer 132, and the third gate insulating layer 133 are sequentially disposed as the gate insulating layer 130. However, embodiments are not limited thereto, and the stack structure of the gate insulating layer 130 and the number of insulating layers of the gate insulating layer 130 are not particularly limited, provided that the first gate insulating layer 130 that has an oxygen content lower than that of the stoichiometric composition exists in an area of the gate insulating layer 130 in contact with the oxide semiconductor layer 120. That is, the gate insulating layer 130 may further include a plurality of insulating layers, and the number of times of stacking the insulating layers is not particularly limited.

Figure 3:
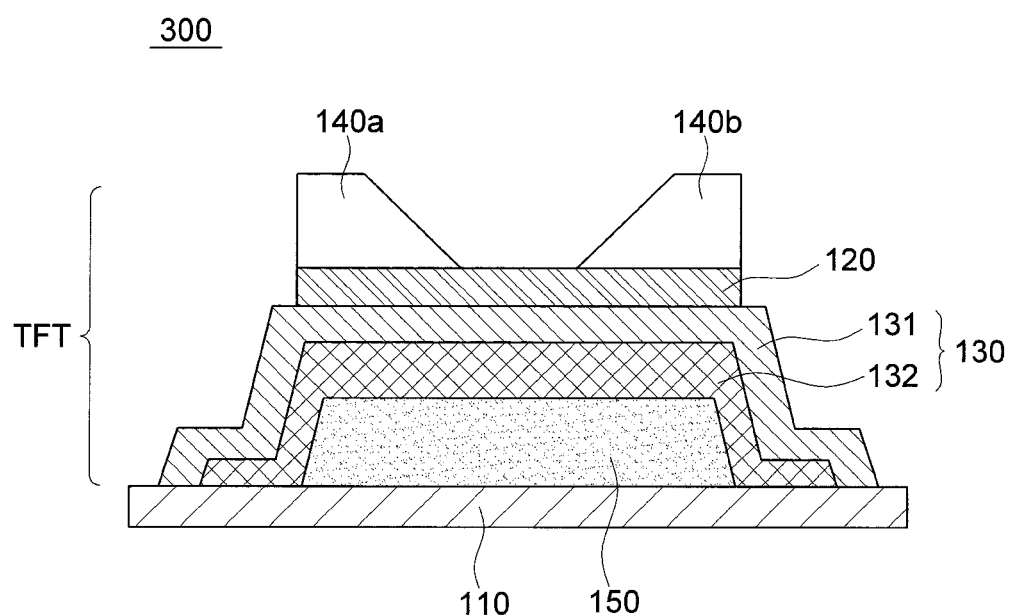
FIG. 3 is a cross-sectional view illustrating a TFT substrate according to another embodiment of the present invention.

FIG. 3 is a cross-sectional view illustrating a TFT substrate 300 according to another embodiment of the present invention. In FIG. 3, the same reference numerals as those in FIG. 1 denote the same members.

In the following description with reference to FIG. 3, the descriptions provided above with reference to FIG. 1 will not be given again, and only differences will be described. Unlike the exemplary embodiments of FIGS. 1 and 2, which illustrate the top gate structure, the TFT of FIG. 3 has a bottom gate structure in which a gate electrode 150 is located below an oxide semiconductor layer 120. In one embodiment, the TFT substrate 300 includes a substrate 110; the gate electrode 150 disposed on the substrate 110; a gate insulating layers 130 disposed on the gate electrode 150 and including at least two layers that includes a first gate insulating layer 131; the oxide semiconductor layer 120 disposed on the gate insulating layer 130; and a source electrode 140*a* and a drain electrode 140*b* connected to the oxide semiconductor layer 120 and spaced apart from each other.

The description of the TFT of FIG. 1 can be applied to the material, the oxide semiconductor, and the like of each constituent element of an exemplary embodiment of FIG. 3, and thus will not be repeated.

FIGS. 1 to 3 illustrate TFTs having a top gate and a bottom gate structure as a specific example. However, embodiments are not limited thereto, and various kinds of TFTs, such as a coplanar type, a staggered type, an inverted staggered type, an etch stop layer (ESL) type, may be also applied and are also included in the scope of the present invention.

FIGS. 4 to 8 are cross-sectional views schematically illustrating a method of manufacturing the TFT substrate 100 of FIG. 1.

In the present disclosure, a method of manufacturing the above-described top gate TFT substrate 100 will be described by way of example. However, the method of manufacturing the TFT related to the present embodiment can be similarly applied to the case of manufacturing another kind of TFT substrates.

Figure 4:
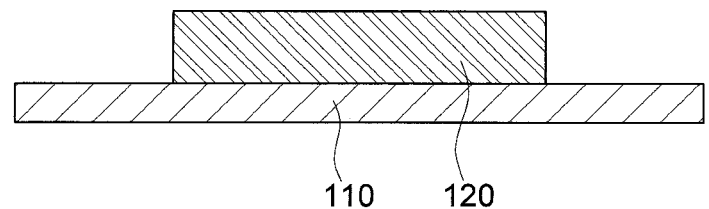
FIGS. 4 to 8 are cross-sectional views schematically illustrating a method of manufacturing the TFT substrate of FIG. 1.

As illustrated in FIG. 4, the substrate 110 for forming a TFT is prepared, and then the oxide semiconductor layer 120 is formed on a surface of the substrate 110.

The substrate 110 may be provided in the form of a planar plate, and may be any one selected from a glass substrate, a plastic substrate, a metal substrate, and the like.

The oxide semiconductor layer 120 may have the structure illustrated in FIG. 1, and various suitable metal oxides (e.g., metal oxides known in the art) may be applied. As an example, the oxide semiconductor layer 120 may be formed utilizing a suitable one of wet process methods, physical methods, and/or chemical methods (e.g., a method known in the art). In one embodiment, the oxide semiconductor layer 120 may be formed, in a selective manner, by wet process methods (such as printing and coating); physical methods (such as vacuum deposition, sputtering and ion plating); and/or chemical methods (such as CVD and plasma CVD). In one embodiment, a vapor deposition method, such as a vacuum vapor deposition method, a sputtering method, an ion plating method, a CVD method, and/or a plasma CVD method, is utilized in consideration of the controllability of thickness of the film.

In the present disclosure, the buffer layer may be formed on an upper surface of the substrate 110 before forming the oxide semiconductor layer 120, in order to substantially prevent penetration of moisture or outside air, and to planarize the surface. The buffer layer may be formed by various deposition methods such as plasma enhanced chemical vapor deposition (PECVD), atmospheric pressure CVD (APCVD), and/or low pressure CVD (LPCVD).

After the oxide semiconductor layer 120 is formed, a patterning process may be performed to form a set or predetermined shape by photolithography, etching, lift-off, and/or the like, if necessary. An annealing process may be performed to adjust the electrical resistivity and the like.

Figure 5:
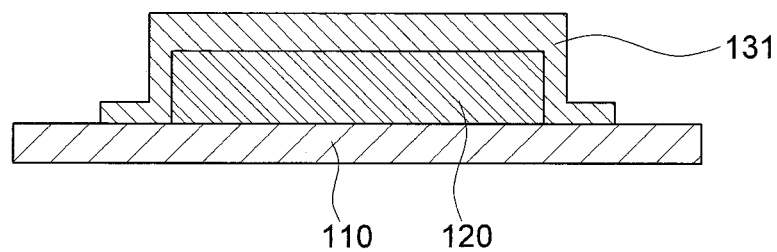

Then, the first gate insulating layer 131 is formed on the oxide semiconductor layer 120 as illustrated in FIG. 5.

The first gate insulating layer 131 may be formed utilizing a suitable deposition method (e.g., a method known in the art). For example, the first gate insulating layer 131 may be formed utilizing one of methods including, for example, plasma enhanced CVD (PECVD), plasma enhanced atomic layer deposition (PEALD), atomic layer deposition (ALD), metal-organic CVD (MOCVD), thermal CVD, and/or sputtering. In one embodiment, the first gate insulating layer 131 is formed utilizing a PECVD method.

According to an embodiment of the present invention, the first gate insulating layer 131 is formed utilizing plasma. In one embodiment, the first gate insulating layer 131 is formed utilizing a power P1, a gas composition (also referred to as a first gas hereinafter) G1, or both of the power P1 and the gas composition G1, where the power P1 and the gas composition G1 utilized to form the first gate insulating layer 131 are lower than a power P2 and a gas composition (also referred to as a second gas hereinafter) G2, respectively, that are required to form the second gate insulating layer (e.g., $SiO_2$) 132 having a stoichiometric composition.

As an example, the first gate insulating layer 131 may be formed by applying the first power P1 that is lower than the second power P2 applied to form the second gate insulating layer 132. In one embodiment, when the second power P2 required for forming the second gate insulating layer (e.g., $SiO_2$) 132 that satisfies the stoichiometric composition is 10 kW, when the first power P1 that is lower than the first power P1 is applied, an insulating layer having an incomplete (e.g., unbalanced) chemical composition is formed. Such an insulating layer having an incomplete chemical composition has an oxygen content lower than that of the stoichiometric composition and/or includes excess hydrogen. The first power P1 for forming the first gate insulating layer 131 is not particularly limited as long as it is lower than the second power P2. For example, the first power P1 may be substantially equal to or lower than about 80% of the second power P2. As an example, when the second power P2 is 10 kW, the first power P1 may be about 8 kW or less, for example, in a range from about 1 kW to about 8 kW.

As another example, the first gate insulating layer 131 may be formed utilizing the first gas G1 having a composition ratio (flow ratio) lower than that of the second gas G2 for forming the second gate insulating layer 132. For example, when the first gas G1 having a composition ratio (flow ratio) lower than that of the second gas G2 required to form the second gate insulating layer (e.g., $SiO_2$) 132 that satisfies the stoichiometric composition, an insulating layer having an incomplete chemical composition and including excess hydrogen is formed as the above exemplary embodiment. The composition of the first gas G1 for forming the first gate insulating layer 131 is not particularly limited, and may be lower than the composition of the second gas G2 for forming the second gate insulating layer 132. For example, the first gas G1 may have a gas composition substantially equal to or more than about 1 and less than about 50. As used herein, each composition of the first gas G1 and the second gas G2 refers to a volume ratio between a reaction gas and a metal precursor gas (e.g., reaction gas/metal precursor gas). For example, the reaction gas may be $N_2O$, $O_3$, $O_2$, $NH_3$, $H_2$, $N_2$, or a mixture thereof. The metal precursor gas may be a precursor gas including at least one element selected from, for example, Si, Al, Ti, Ga, Ta, Mn, Zn, Zr, Hf and La. In one embodiment, silane ($SiH_4$), tetrakis (dimethylamino) titanium (TDMAT), trimethyl aluminum (TMA), and/or the like may be utilized as the metal precursor gas. The metal precursor gas may further include an inert gas.

In an exemplary embodiment, the gas composition (flow ratio) varies depending on the component of an insulating layer to be formed. For example, when a silicon oxide ($SiO_2$) layer that satisfies the stoichiometric composition is formed, the volume ratio between the reactive gas and the metal precursor gas (e.g., $N_2O$:$SiH_4$) is about 100:2, and thus the gas composition (reaction gas/metal precursor gas) forming the second gas G2 may be about 50. Accordingly, when the first gate insulating layer ($SiO_{2-x}$) 131 having an oxygen content lower than that of the stoichiometric composition is formed, the volume ratio between the reactive gas and the metal precursor gas (e.g., $N_2O$:$SiH_4$) may be adjusted to be less than about 100:2 and substantially equal to or greater than about 100:100, and thus the gas composition (e.g., a volume ratio of reaction gas/metal precursor gas) of the first gas G1 may be substantially equal to or more than about 1 and less than about 50.

In another exemplary embodiment, the first gate insulating layer 131 may be formed utilizing both the first power P1 and the first gas G1.

Figure 6:
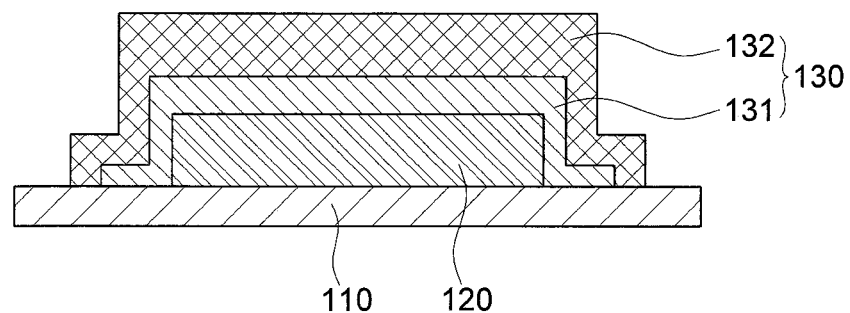

Then, the second gate insulating layer 132 is formed on the first gate insulating layer 131, as illustrated in FIG. 6.

The second gate insulating layer 132 may be formed utilizing the same method utilized to form the first gate insulating layer 131 described above, except that at least one of the second power P2 and the second gas G2 that are higher than the first power P1 and the first gas G1, respectively, is utilized. The second gate insulating layer 132 may include a material substantially the same as a material included in the first gate insulating layer 131, but may have a stoichiometric composition different from that of the first gate insulating layer 131. In one embodiment, the second gate insulating layer 132 may be a material that satisfies the stoichiometric ratio.

Although not illustrated in the drawing, a process of forming the third gate insulating layer 133 on the second gate insulating layer 132 may be further performed. The third gate insulating layer 133 may include a material different from the material included in the first gate insulating layer 131 and the second gate insulating layer 132. In addition, the third gate insulating layer 133 may have a multilayer structure including two or more layers, with each layer including different materials.

Figure 9:
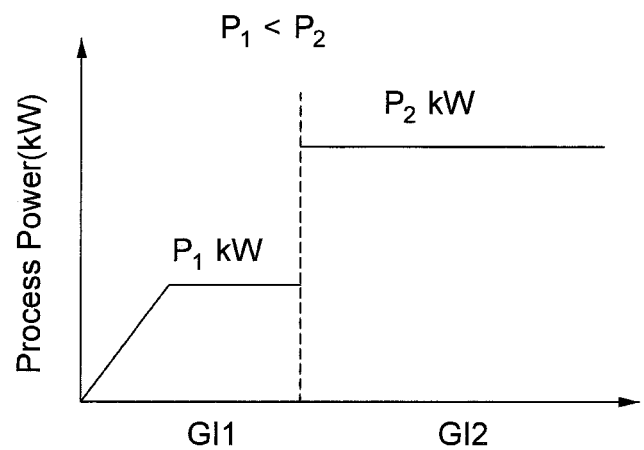
FIG. 9 is a graph illustrating changes in plasma power utilized for manufacturing the TFT substrate of FIG. 1.

FIG. 9 is a graph illustrating plasma power utilized for manufacturing a first gate insulating layer GI1 and a second gate insulating layer GI2. Referring to FIG. 9, the first gate insulating layer GI1 is formed through plasma treatment with a first power (kW) P1, and the second gate insulating layer GI2 is formed through plasma treatment with a second power (kW) P2 that is higher than the first power (kW) P1. For example, the first power (kW) P1 may be substantially equal to or less than about 80% of the second power (kW) P2. For example, when the second power (kW) P2 is 10 kW, the first power (kW) P1 may be substantially equal to or less than about 8 kW.

Figure 10:
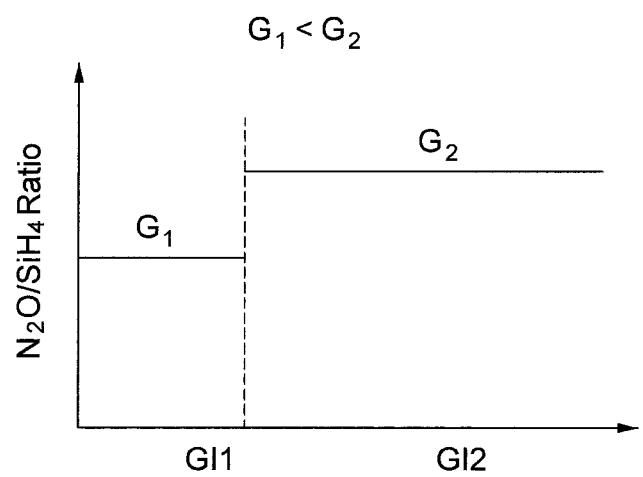
FIG. 10 is a graph illustrating changes in gas composition utilized for manufacturing the TFT substrate of FIG. 1.

FIG. 10 is a graph illustrating gas composition ratios utilized for manufacturing the first gate insulating layer GI1 and the second gate insulating layer GI2. Referring to FIG. 10, the first gate insulating layer GI1 is formed through plasma treatment utilizing the first gas G1, and the second gate insulating layer GI2 is formed through plasma treatment utilizing the second gas G2 that has a composition ratio (flow ratio) higher than that of the first gas G1. For example, the first gas G1 may have a composition ratio (e.g., a volume ratio of reaction gas/metal precursor gas) lower than that of the second gas G2, and may be, for example, substantially equal to or more than about 1 and less than about 50.

An annealing process may be further performed after forming the gate insulating layer 130 including at least two layers. The temperature range of the annealing process is not particularly limited and may be appropriately adjusted within a suitable range (e.g., a range known in the art). When such an annealing process is performed after the gate insulating layer 130 is formed, part of the hydrogen included in the first gate insulating layer 131 is diffused to the interface between the first gate insulating layer 131 and the oxide semiconductor layer 120 and/or to the inside of the oxide semiconductor layer 120. The hydrogen introduced to the oxide semiconductor may absorb excess oxygen, thus reducing a density of oxygen defects in a sub-gap of a conduction band of the oxide semiconductor.

Figure 7:
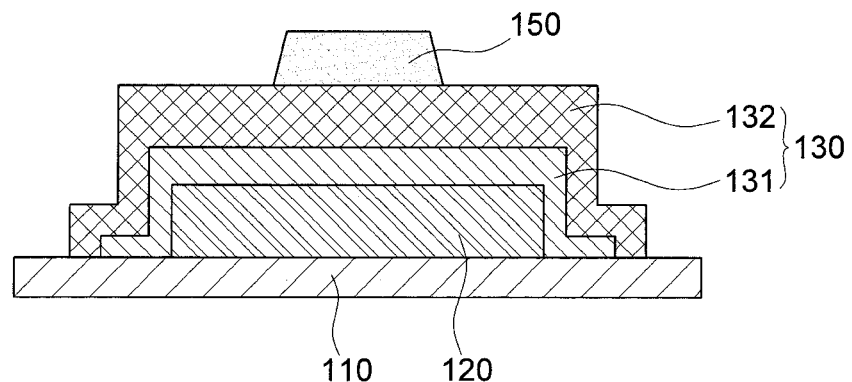

After the gate insulating layer 130 is formed, the gate electrode 150 is formed as illustrated in FIG. 7.

The gate electrode 150 may be formed by a suitable method (e.g., a method known in the art). For example, a conductive film is formed by wet process methods such as printing and coating; physical methods such as vacuum deposition, sputtering and ion plating; and/or chemical methods such as CVD and plasma CVD, in consideration of suitability with a material. After the conductive film is formed, the conductive film is patterned into a set or predetermined shape by photolithography, etching, lift-off, and/or the like, and thus the gate electrode 150 is formed from the conductive film. In this embodiment, the gate electrode 150 and gate wirings may be patterned concurrently or substantially simultaneously. By patterning the gate electrode 150, the gate insulating layer 130 may be exposed to the outside through the portion on an outer circumferential surface of the gate electrode 150.

The conductive film forming the gate electrode 150 may include any suitable material having high conductivity. For example, the conductive film forming the gate electrode 150 may include a metal and/or a metal oxide conductive layer that includes at least one of: metals selected from Al, Mo, Cr, Ta, Ti and Au; Al-Nd; Ag alloys; tin oxide; zinc oxide; indium oxide; indium tin oxide (ITO); indium zinc oxide (IZO); and the like.

Figure 8:
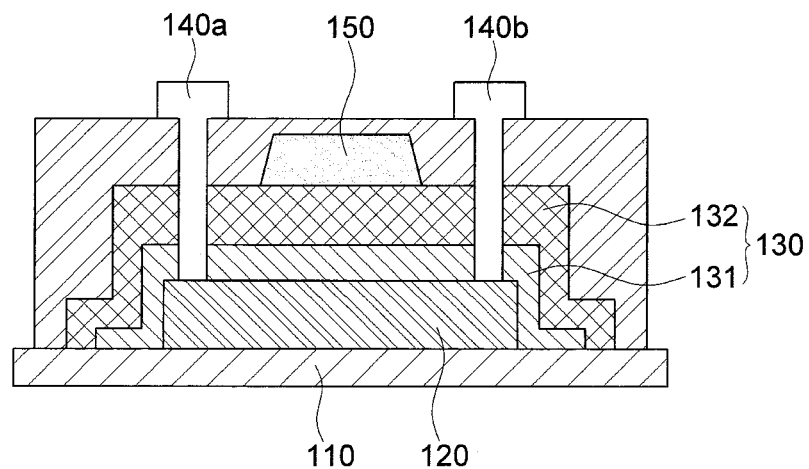

Next, the source electrode 140a and the drain electrode 140b are formed, as illustrated in FIG. 8, and are each connected to the oxide semiconductor layer 120.

The source electrode 140a and the drain electrode 140b may each be formed utilizing a suitable method (e.g., a method known in the art), and then connected to the oxide semiconductor layer 120. For example, after forming an insulating interlayer over an entire surface of the substrate 110 including the gate electrode 150, the gate insulating layer 130 and the insulating interlayer are etched to define a contact hole, a low resistance metal layer is deposited thereon and etched, and thus each of the source electrode 140a and the drain electrode 140b that contacts the oxide semiconductor layer 120 is formed.

In the present disclosure, a method of manufacturing a top gate TFT substrate in which the oxide semiconductor layer 120, the gate insulating layer 130 that includes at least two layers including the first gate insulating layer 131, the gate electrode 150, the source electrode 140a and the drain electrode 140b are stacked is described by way of example. However, embodiments are not limited to the above manufacturing method, and each process may be modified or optionally mixed as necessary.

In the present disclosure, the oxygen content and/or the amount of hydrogen included in the first gate insulating layer is changed according to the plasma power P1 and/or the gas composition ratio (flow ratio) G1 utilized to form the film. The amount of hydrogen can be accurately analyzed utilizing a hydrogen concentration analysis method such as secondary ion mass spectroscopy (SIMS).

Figure 11:
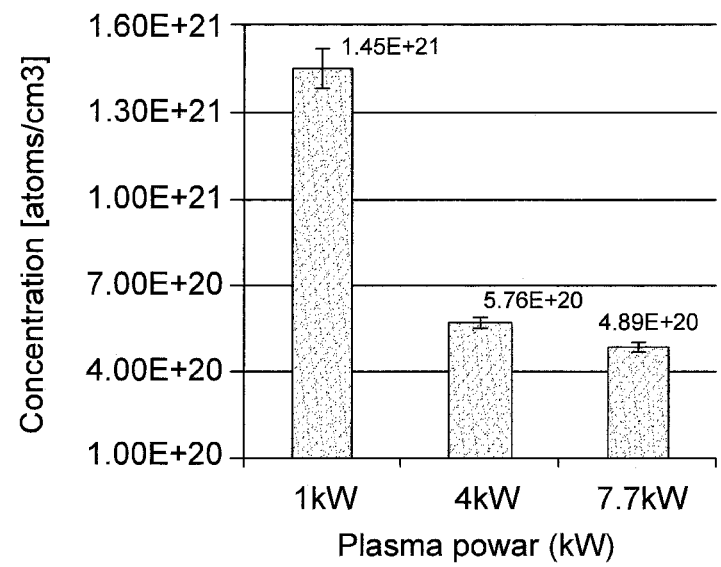
FIG. 11 is a secondary ion mass spectroscopy ("SIMS") graph illustrating changes in the content of hydrogen in a first gate insulating layer according to the plasma power.

FIG. 11 is a secondary ion mass spectroscopy ("SIMS") graph illustrating changes in the content of hydrogen in the first gate insulating layer ($SiO_x$, where x<2) according to the plasma power. Referring to FIG. 11, it may be appreciated that the hydrogen content in the first gate insulating layer significantly increases as the plasma power P1 is lowered.

Figure 12:
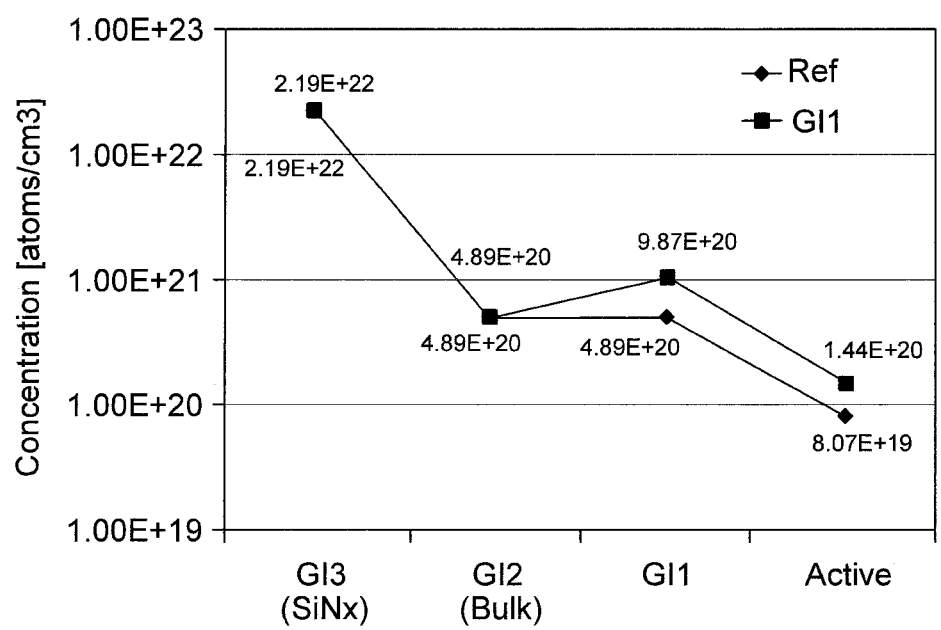
FIG. 12 is a SIMS graph illustrating changes in the content of hydrogen included in a gate insulating layer according to the sub-layers.

FIG. 12 is a SIMS graph illustrating changes in the content of hydrogen included in a gate insulating layer according to the sub-layers. Referring to FIG. 12, it may be appreciated that the hydrogen content of the first gate insulating layer GI1 is relatively higher than the hydrogen content of the second gate insulating layer GI2 according to an embodiment of the present disclosure (i.e., sample identified as GI1, in contrast to the sample identified as Ref). The hydrogen content of the first gate insulating layer GI1 varies along the thickness direction thereof. There appears the tendency that the hydrogen content of the first gate insulating layer GI1 increases toward the center of the first gate insulating layer GI1, and decreases toward opposite side surfaces of the first gate insulating layer GI1 (e.g., towards GI2 and towards active). In this embodiment, because the third gate insulating layer GI3 includes a $SiN_x$ layer, it may be appreciated that the hydrogen content thereof is the highest in the gate insulating layer.

Figure 13:
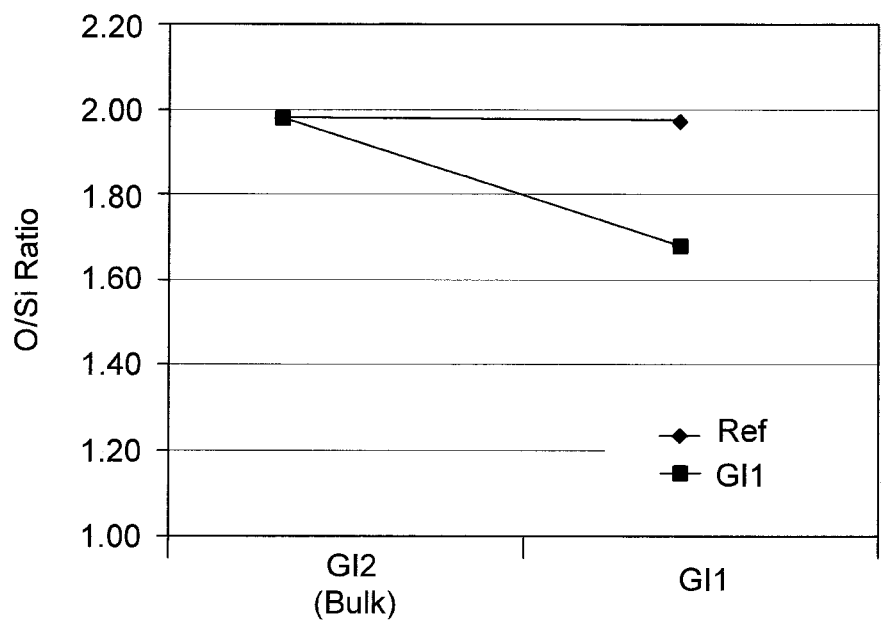
FIG. 13 is a graph illustrating an O/Si atomic weight ratio in the gate insulating layer.

FIG. 13 is a graph illustrating an O/Si atomic weight ratio in the gate insulating layer based on silicon oxide. Referring to FIG. 13, Ref represents a gate insulating layer that does not include the first gate insulating layer, which exhibits an O/Si atomic weight ratio of about 2 over the entire region (e.g., the entire gate insulating layer), thus substantially satisfying a stoichiometric composition ($SiO_2$). On the other hand, an O/Si atomic weight ratio of the first gate insulating layer GI1 is about 1.69, which is outside (i.e., below) the stoichiometric ratio. Particularly, the O/Si atomic weight ratio of the first gate insulating layer GI1 decreases as a distance from the oxide semiconductor layer decreases. This tendency may exhibit substantially the same for hydrogen concentration distribution even when hydrogen gas is utilized in comparable vapor deposition methods (e.g., MOCVD and ALD, methods known in the art), other than plasma treatment (e.g., PECVD).

Figure 14:
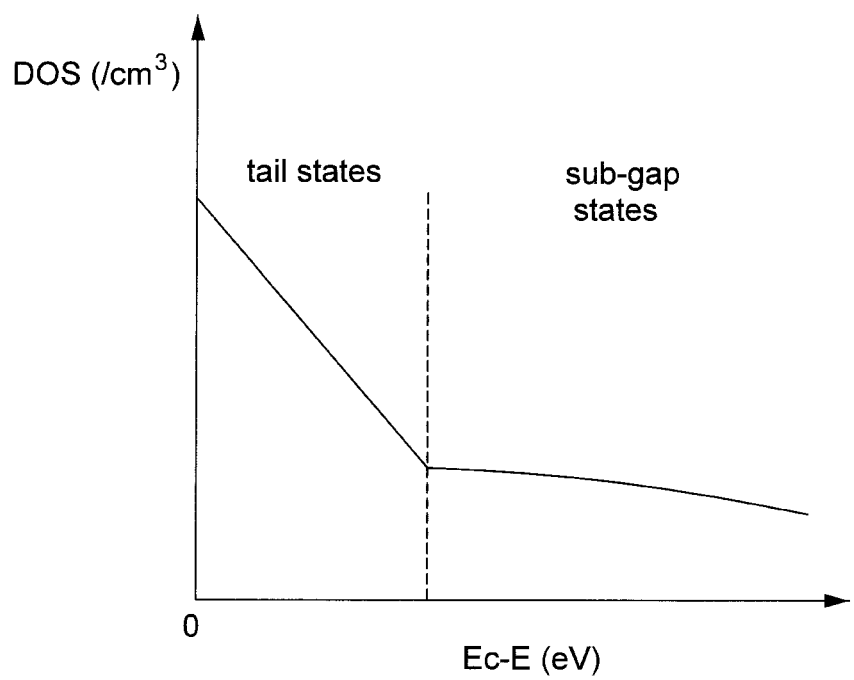
FIG. 14 is a graph illustrating changes in density of state ("DOS") of a conduction band of an oxide semiconductor layer.
Figure 15:
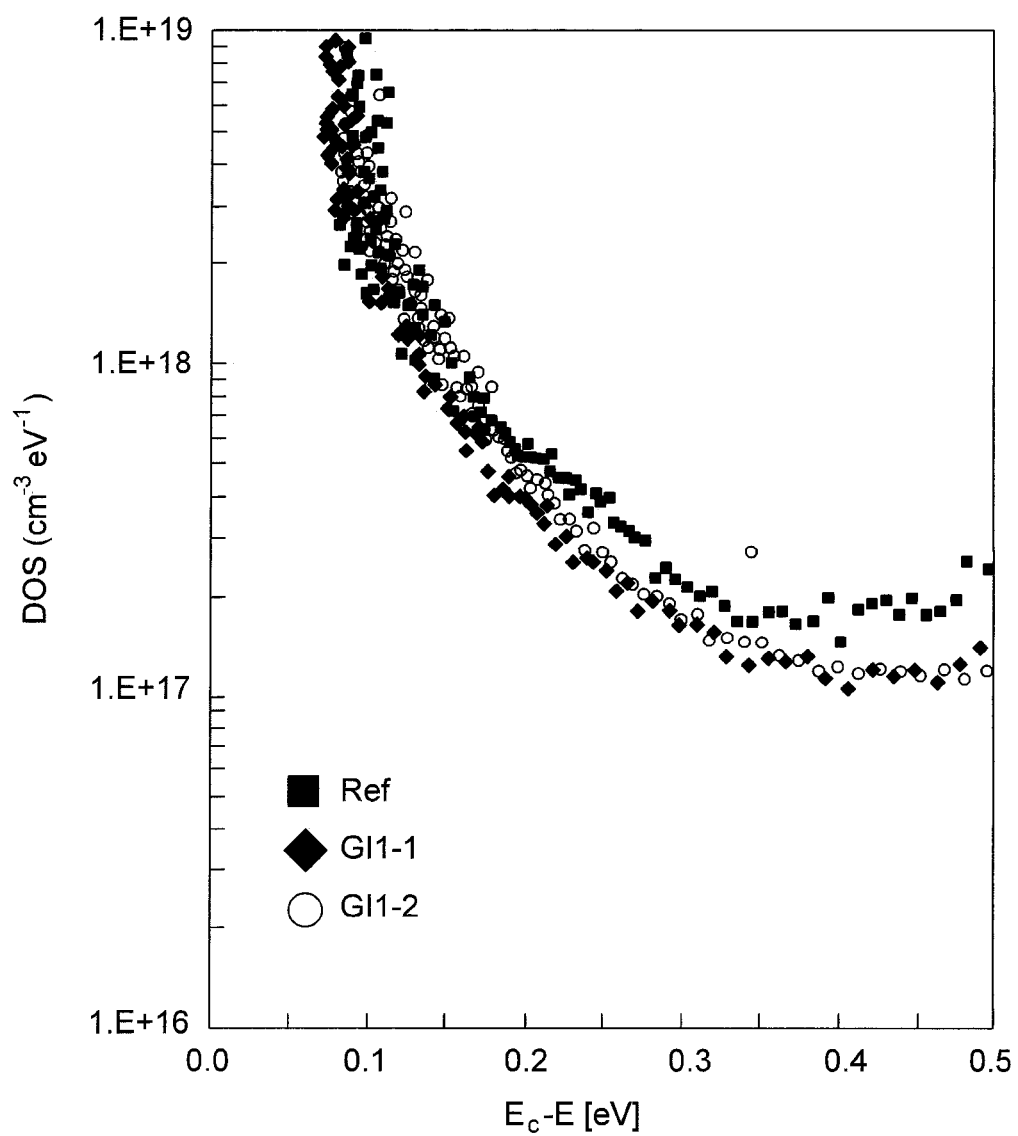
FIG. 15 is a graph illustrating changes in DOS of a conduction band of an oxide semiconductor layer.
Figure 16:
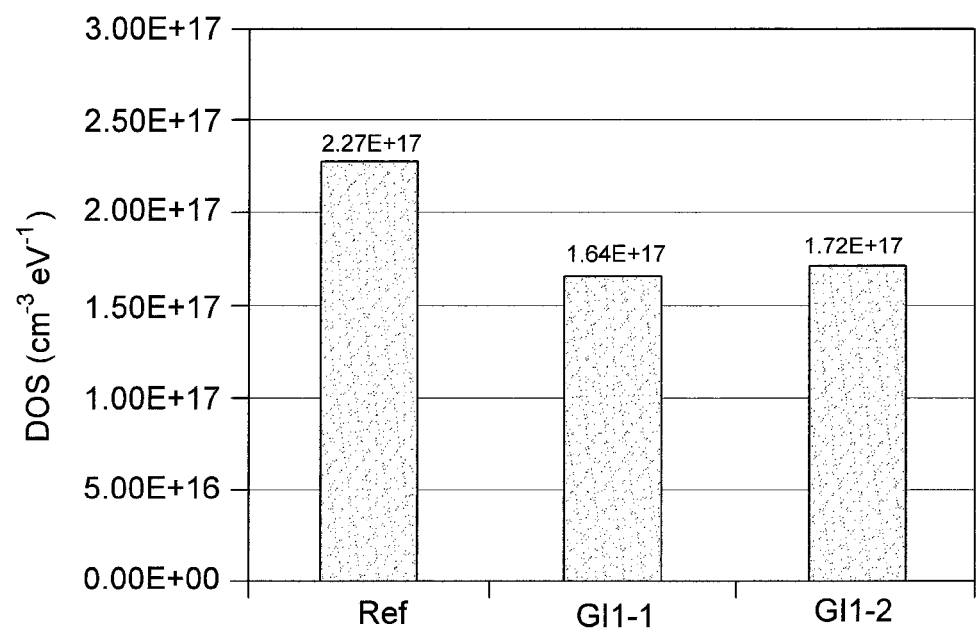
FIG. 16 is a graph illustrating changes in DOS of a conduction band of an oxide semiconductor layer.

FIGS. 14 to 16 are graphs illustrating changes in density of state ("DOS") of the oxide semiconductor layer.

Excess oxygen, which is in an electrically neutral state, is generally weakly bonded to oxygen atoms in the oxide semiconductor and is present as an O—O dimer. Such an O—O dimer has an electronic structure similar to that of an oxygen molecule, and thus causes an increase in DOS in the vicinity of a lower end of the conduction band of the oxide semiconductor, that is, in the sub-gap region.

FIG. 14 shows the conduction band of the oxide semiconductor layer in contact with the first gate insulating layer. Referring to FIG. 14, because the oxide semiconductor layer of the present disclosure is in contact with the first gate insulating layer, DOS in the sub-gap of the conduction band is decreased.

FIGS. 15 and 16 show respective changes in DOS of an oxide semiconductor layer Ref that does not include the first gate insulating layer, an oxide semiconductor layer GI1-1 in contact with a first gate insulating layer formed by controlling the plasma power, and an oxide semiconductor layer GI1-2 in contact with a first gate insulating layer formed by controlling the gas composition ratio (flow ratio).

Referring to FIG. 16, the oxide semiconductor layer Ref that does not include the first gate insulating layer shows a density of oxygen defects of about 2.27E+17 $cm^{-3}$ $eV^{-1}$. On the other hand, the oxide semiconductor layer GI1-1 in contact with the first gate insulating layer formed by controlling the plasma power shows a density of oxygen defects of about 1.64E+17 cm$^{-3}$ eV$^{-1}$, and the oxide semiconductor layer GI1-2 in contact with the first gate insulating layer formed by controlling the gas composition ratio shows a density of oxygen defects of about 1.72E+17 cm$^{-3}$ eV$^{-1}$, indicating that the oxygen defects were significantly reduced.

Based on the results shown in FIGS. 11 to 16, it may be appreciated that the first gate insulating layer according to the present disclosure includes excess hydrogen, which flows into the adjacent oxide semiconductor to reduce excess oxygen and provides effects of defect state passivation.

Figure 17:
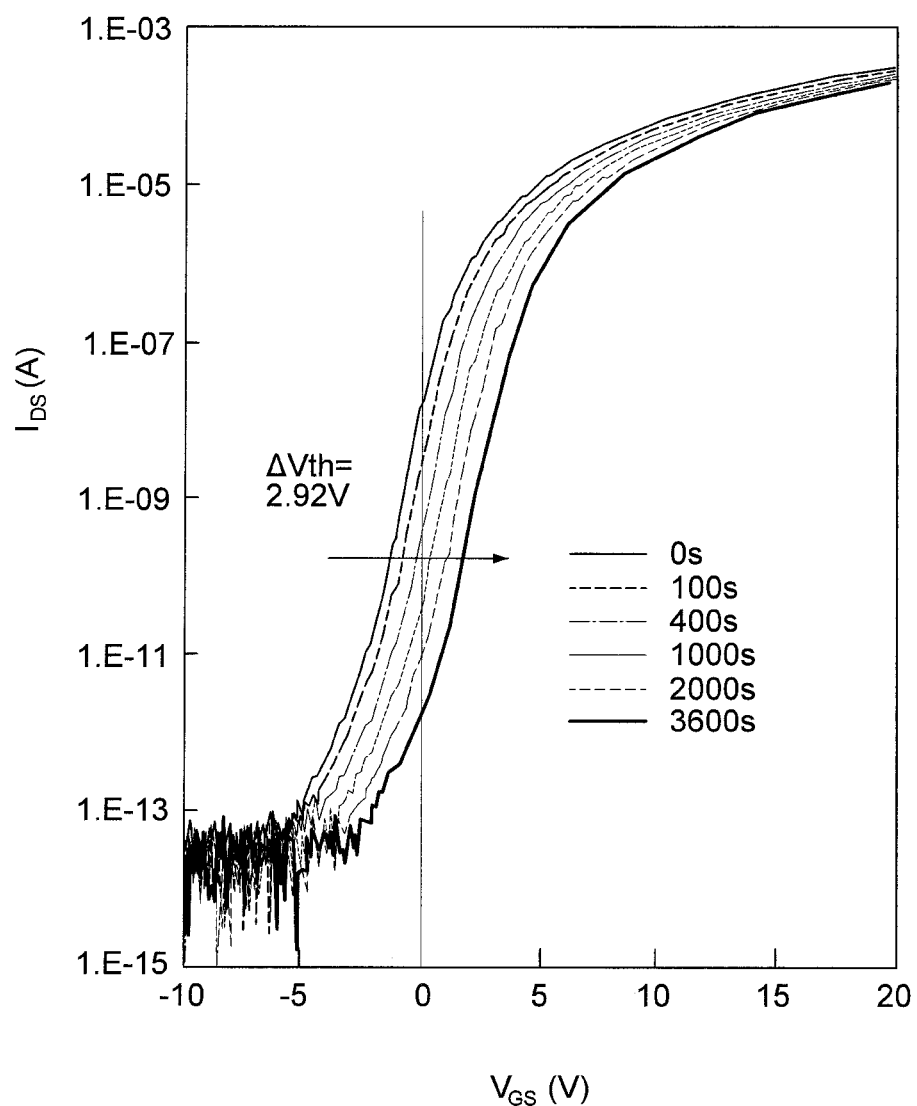
FIG. 17 is a graph illustrating a positive bias temperature stress ("PBTS") value of a TFT that does not include the first gate insulating layer.
Figure 18:
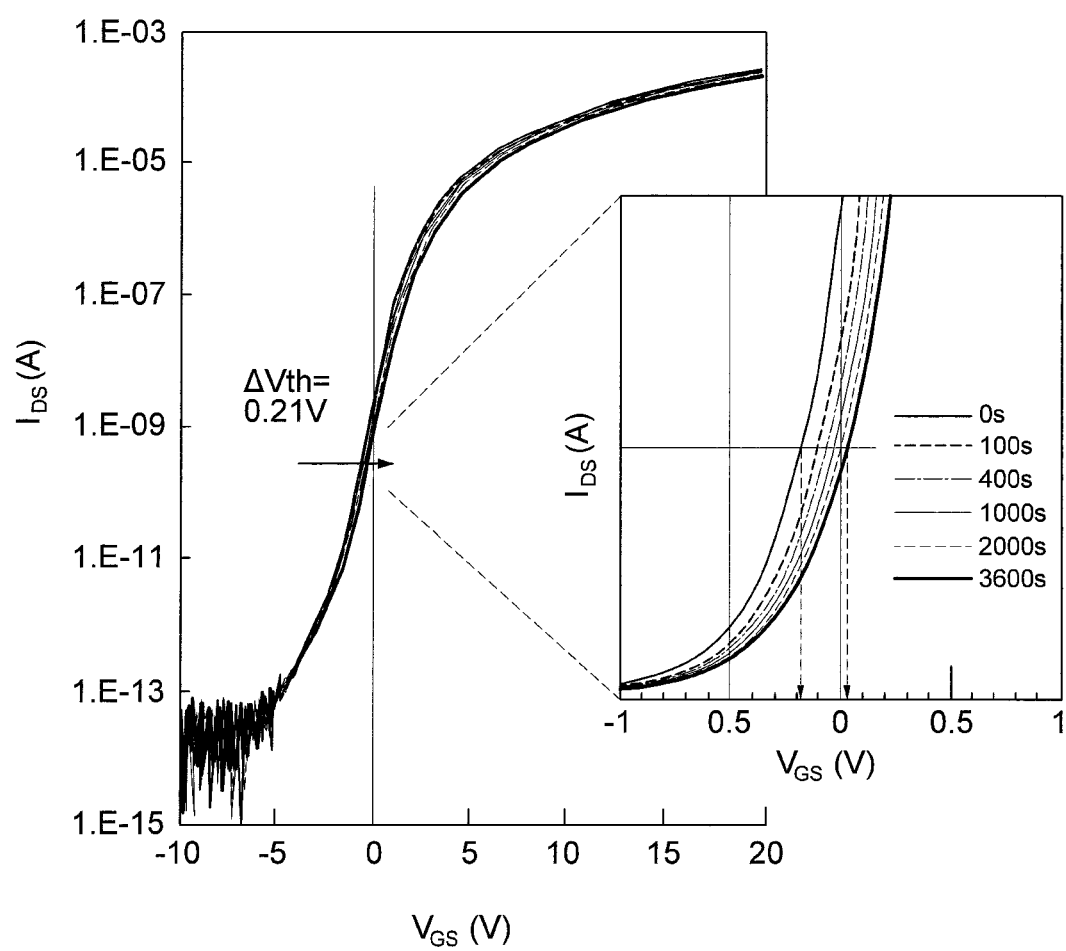
FIG. 18 is a graph illustrating a PBTS value of a TFT that includes the first gate insulating layer.

FIGS. 17 and 18 are graphs illustrating positive bias temperature stress ("PBTS") values of TFTs.

Referring to FIG. 17, when about 1 nA is applied for about 1 hour under conditions of a gate voltage Vgs of about 37 V, a drain voltage Vds of about 0 V, and a temperature of about 70° C., a TFT that does not include the first gate insulating layer shows a shift of a threshold voltage ΔVth by about 2.92 V according to the stress time. On the other hand, a TFT that includes the first gate insulating layer illustrated in FIG. 18 shows a shift of a threshold voltage ΔVth by about 0.21 V according to the stress time under the same condition, indicating the desired effect in terms of stability of the threshold voltage Vth.

Figure 19:
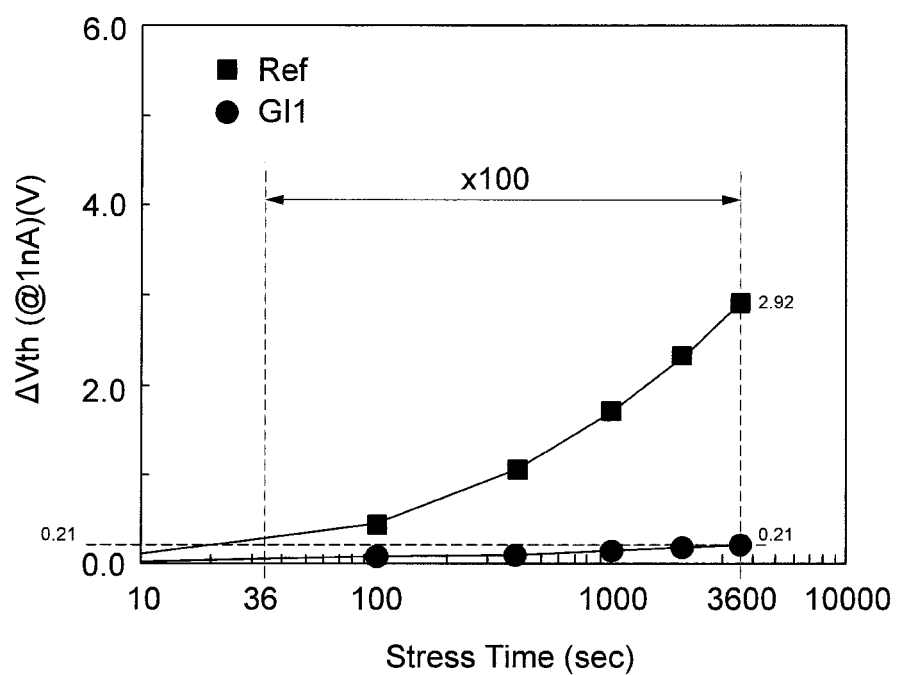
FIG. 19 is a graph illustrating changes in a threshold voltage Vth with respect to a cumulative time based on the results of FIGS. 17 and 18.

FIG. 19 is a graph illustrating changes in a threshold voltage Vth with respect to a cumulative time based on the results of FIGS. 17 and 18. Referring to FIG. 19, it may be appreciated that the TFT of the present disclosure that includes the first gate insulating layer secures the stability of the threshold voltage Vth (e.g., improved by about 100 times or more) as compared with that of the TFT that does not include the first gate insulating layer.

According to the above-described embodiments, as the TFT substrate of the present disclosure includes the first gate insulating layer 131 having an oxygen content lower than that of the stoichiometric composition and/or including excess hydrogen on the interface of the gate insulating layer 130 in contact with the oxide semiconductor layer 120, the defects due to excess oxygen in the oxide semiconductor layer 120 may be controlled and the photoelectric reliability of the element may be improved.

The TFT substrate including the first gate insulating layer according to embodiments of the present invention and the modified exemplary embodiments thereof may be applied without limitation to display devices that are known in the art and include TFTs.

In the present disclosure, the display device refers to a device for displaying images, and is not limited to flat panel display devices (FPDs). Non-limiting examples of the display device may include curved display devices, foldable display devices, and flexible display devices. Non-limiting examples of the display device may be liquid crystal display (LCD) devices, electrophoretic display devices, organic light emitting diode ("OLED") display devices, inorganic light emitting display devices, field emission display devices, surface-conduction electron-emitter display devices, plasma display devices, cathode ray display devices, and/or the like.

As set forth hereinabove, one or more embodiments of the present invention may provide a TFT that has high reliability by controlling defects due to excess oxygen included in the oxide semiconductor. Accordingly, a display device including the oxide semiconductor TFTs that have high reliability may be manufactured.

The effects of embodiments of the present invention are not limited by the descriptions exemplified above, and more various effects may be presented.

While the present invention has been illustrated and described with reference to the embodiments thereof, it will be apparent to those of ordinary skill in the art that various changes in form and detail may be formed thereto without departing from the spirit and scope of the present invention.

What is claimed is:

1. A thin film transistor substrate comprising:
 a substrate;
 an oxide semiconductor layer on the substrate;
 a gate electrode on the substrate;
 a gate insulating layer between the oxide semiconductor layer and the gate electrode; and
 a source electrode and a drain electrode both connected to the oxide semiconductor layer, the source electrode and the drain electrode being spaced apart from each other,
 wherein the gate insulating layer comprises:
 a first gate insulating layer comprising a first material and having an oxygen content lower than that of a stoichiometric composition of the first material; and
 a second gate insulating layer comprising a second material substantially the same as the first material, and having an oxygen content higher than that of the first gate insulating layer, and
 the first gate insulating layer and the oxide semiconductor layer directly contact each other.

2. The thin film transistor substrate of claim 1, wherein the first gate insulating layer comprises a metal oxide or a metal oxynitride that has an oxygen content lower than that of the stoichiometric composition.

3. The thin film transistor substrate of claim 1, wherein the first gate insulating layer comprises one or more materials selected from: SiO$_x$ (0<x<2), AlO$_x$(0<x<3/2), ZnO$_x$ (0<x<1), ZrO$_x$ (0<x<2), HfO$_x$ (0<x<2), GaO$_x$ (0<x<3/2), TiO$_x$ (0<x<2), TaO$_x$ (0<x<3/2), MnO$_x$ (0<x<2), LaO$_x$ (0<x<3/2), SiO$_x$Ny (0<x<1, 0<y<2/3, and 0<x+y<5/3), AlO$_x$Ny (0<x<3/4, 0<y<1/2, and 0<x+y<5/4), and GaO$_x$Ny (0<x<3/4, 0<y<1/2, and 0<x+y<5/4).

4. The thin film transistor substrate of claim 1, wherein the first gate insulating layer comprises silicon oxide represented by SiO$_x$, where 0<x<2, and
 an atomic weight ratio O/Si of oxygen to silicon in the silicon oxide is substantially equal to or more than about 1.5 and less than about 2.0.

5. The thin film transistor substrate of claim 4, wherein the atomic weight ratio O/Si in the silicon oxide decreases along a thickness direction as a distance from the oxide semiconductor layer decreases.

6. The thin film transistor substrate of claim 1, wherein the first gate insulating layer has an excess hydrogen content of about 5.0×10$^{20}$ atoms/cm$^3$.

7. The thin film transistor substrate of claim 1, wherein the first gate insulating layer has a hydrogen content that varies along a thickness direction of the first gate insulating layer.

8. The thin film transistor substrate of claim 1, wherein the first gate insulating layer has a thickness substantially equal to or less than about 500 Å.

9. The thin film transistor substrate of claim 1, wherein the gate insulating layer further comprises a third gate insulating layer comprising a third material different from the first material.

10. The thin film transistor substrate of claim 9, wherein the third gate insulating layer is an oxide-based insulating layer, an oxynitride-based insulating layer, or a nitride-based insulating layer.

11. The thin film transistor substrate of claim 1, wherein the oxide semiconductor layer comprises a metal oxide semiconductor comprising oxygen, and has a density of oxygen defects of about $2.0 \times 10^{17}$ $cm^{-3}$ $eV^{-1}$.

12. The thin film transistor substrate of claim 1, wherein the oxide semiconductor layer comprises at least one selected from: indium (In), gallium (Ga), tin (Sn), zirconium (Zr), vanadium (V), hafnium (Hf), cadmium (Cd), germanium (Ge), chromium (Cr), titanium (Ti), and zinc (Zn).

13. The thin film transistor substrate of claim 1, comprising:
- the substrate;
- the oxide semiconductor layer on the substrate;
- the first gate insulating layer on the oxide semiconductor layer;
- the second gate insulating layer on the first gate insulating layer;
- the gate electrode on the second gate insulating layer; and
- the source electrode and the drain electrode both connected to the oxide semiconductor layer, the source electrode and the drain electrode being spaced apart from each other.

14. The thin film transistor substrate of claim 1, comprising:
- the substrate;
- the gate electrode on the substrate;
- the second gate insulating layer on the gate electrode;
- the first gate insulating layer on the second gate insulating layer;
- the oxide semiconductor layer on the first gate insulating layer; and
- the source electrode and the drain electrode both connected to the oxide semiconductor layer, the source electrode and the drain electrode being spaced apart from each other.

* * * * *